(12) United States Patent
Chadwick et al.

(10) Patent No.: US 7,849,433 B2
(45) Date of Patent: Dec. 7, 2010

(54) INTEGRATED CIRCUIT WITH UNIFORM POLYSILICON PERIMETER DENSITY, METHOD AND DESIGN STRUCTURE

(75) Inventors: Laura S. Chadwick, Essex Junction, VT (US); James A. Culp, Downingtown, PA (US); David J Hathaway, Underhill, VT (US); Anthony D. Polson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 214 days.

(21) Appl. No.: 12/117,771

(22) Filed: May 9, 2008

(65) Prior Publication Data

US 2009/0278222 A1   Nov. 12, 2009

(51) Int. Cl.
*G06F 17/50* (2006.01)

(52) U.S. Cl. .................. 716/11; 716/1; 716/17
(58) Field of Classification Search ............ 716/1, 716/11, 17
See application file for complete search history.

(56) References Cited

U.S. PATENT DOCUMENTS

| | | | |
|---|---|---|---|
| 6,807,656 | B1 | 10/2004 | Gradin et al. |
| 6,938,226 | B2 | 8/2005 | Nguyen et al. |
| 7,089,520 | B2 * | 8/2006 | Voldman ............ 716/9 |
| 7,095,063 | B2 | 8/2006 | Cohn et al. |

2007/0118320 A1   5/2007   Luo et al.

OTHER PUBLICATIONS

Kahng, et al., "Filling Algorithms and Analyses for Layout Density Control," IEEE Transactions on Computer-Aided Design of Integrated Circuits and Systems, vol. 18, No. 4, Apr. 1999, pp. 445-462.
Kahng, A., "IC Layout and Manufacturability: Critical Links and Design Flow Implications," UCLA Department of Computer Science, pp. 1-6.

* cited by examiner

*Primary Examiner*—Thuan Do
(74) *Attorney, Agent, or Firm*—Gibb I.P. Law Firm, LLC; Richard M. Kotulak, Esq.

(57) ABSTRACT

Disclosed are embodiments of forming an integrated circuit with a desired decoupling capacitance and with the uniform and targeted across-chip polysilicon perimeter density. The method includes laying out functional blocks to form the circuit according to the design and also laying out one or more decoupling capacitor blocks to achieve the desired decoupling capacitance. Then, local polysilicon perimeter densities of the blocks are determined and, as necessary, the decoupling capacitor blocks are reconfigured in order to adjust for differences in the local polysilicon perimeter densities. This reconfiguring is performed in a manner that essentially maintains the desired decoupling capacitance. Due to the across-chip polysilicon perimeter density uniformity, functional devices in different regions of the chip will exhibit limited performance parameter variations (e.g., limited threshold voltage variations). Also disclosed herein are embodiments of an integrated circuit structure formed according to the method embodiments and a design structure for the integrated circuit.

9 Claims, 5 Drawing Sheets

VARY ASPECT RATIO

TO INCREASE PPD

TO DECREASE PPD

SERPENTINE EDGES
TO INCREASE PPD

INTEGRATED CIRCUIT WITH UNIFORM POLYSILICON PERIMETER DENSITY, METHOD AND DESIGN STRUCTURE

CROSS-REFERENCE TO RELATED APPLICATIONS

This application is related to the following co-pending applications filed concurrently herewith by the same Applicants and assigned to the same Assignee, namely, International Business Machines Corporation (IBM Corporation): "INTEGRATED CIRCUIT WITH UNIFORM POLYSILICON PERIMETER DENSITY, METHOD AND DESIGN STRUCTURE" Ser. No. 12/117,855 and "METHOD OF LAYING OUT INTEGRATED CIRCUIT DESIGN BASED ON KNOWN POLYSILICON PERIMETER DENSITIES OF INDIVIDUAL CELLS" Ser. No. 11/117,761. The complete disclosures of these co-pending applications are incorporated herein by reference.

FIELD OF THE INVENTION

The embodiments of the invention generally relate to the impacts of across-chip polysilicon perimeter density variations on device performance parameters and, more particularly, to an integrated circuit with uniform polysilicon perimeter density, an associated method of forming such an integrated circuit and a design structure for such an integrated circuit.

With continued scaling of integrated circuit devices, product developers have noticed variations in performance parameters of devices located within different regions on the same chip. Thus, there is a need in the art for a method of forming integrated circuits that allows for continued device scaling, while minimizing across-chip performance parameter variations.

BRIEF SUMMARY OF THE INVENTION

Disclosed herein are embodiments of a method of laying out an integrated circuit design so that once the integrated circuit is formed a desired decoupling capacitance is achieved and further so that across-chip polysilicon perimeter density will be approximately uniform and, optionally, approximately equal to a predetermined value. The method embodiments achieve the desired decoupling capacitance and the uniform and targeted across-chip polysilicon perimeter density by laying out the functional blocks to form the circuit according to the design and also laying out one or more decoupling capacitor blocks to achieve the desired decoupling capacitance. Then, local polysilicon perimeter densities of the blocks are determined and, as necessary, the decoupling capacitor blocks are reconfigured in order to adjust for differences in the local polysilicon perimeter densities. This reconfiguring is performed in a manner that essentially maintains the desired decoupling capacitance. Due to the across-chip polysilicon perimeter density uniformity, functional devices in different regions of the chip will exhibit limited performance parameter variations (e.g., limited threshold voltage variations). Also disclosed herein are embodiments of an integrated circuit structure formed according to the method embodiments and a design structure for the integrated circuit.

More particularly, in the method embodiments, the design for the integrated circuit is received. Then, the configurations and locations for multiple first blocks comprising functional devices, which are required to form the integrated circuit according to the received design, are determined. The above-described method embodiments can be incorporated into a completely customized circuit design layout process or into an Application-Specific Integrated Circuit (ASIC) design layout process. Thus, this process can be customized or can be accomplished by selecting the first blocks from amongst predefined functional device cells in an ASIC cell library.

Additionally, to achieve a desired decoupling capacitance, the location on the chip and the configuration of one or more second blocks, each comprising one or more decoupling capacitors, are determined. As with the first blocks, this process can be customized or can be accomplished by selecting the one or more second blocks from amongst predefined decoupling capacitor cells in an ASIC cell library.

Once the first and second blocks are laid out on the chip, the different local polysilicon perimeter densities of these blocks are determined. Polysilicon perimeter density can be determined by dividing the sum of the perimeter of all polysilicon shapes in a defined region of the integrated circuit by the area of the defined region.

Next, if necessary, one or more of the second blocks are reconfigured in order to achieve a polysilicon perimeter density that is approximately uniform across the chip, while also essentially maintaining the desired decoupling capacitance. This reconfiguring process can also, optionally, be performed so that the across-chip uniform polysilicon perimeter density is approximately equal to a predetermined value. Specifically, the reconfiguring process is performed by replacing one or more of the decoupling capacitors in one or more of the second blocks in order to adjust (i.e., increase or decrease, as necessary) the local polysilicon perimeter density in the region of those second blocks and in order to balance out any differences in the local polysilicon perimeter densities of the multiple first blocks. Balancing out the different local polysilicon perimeter densities of the multiple first blocks ensures that a polysilicon perimeter density that is approximately uniform across the chip is achieved.

For example, if the predetermined value for the across-chip uniform polysilicon perimeter density comprises an intermediate value, then the reconfiguring process can comprise reconfiguring a second block by replacing its decoupling capacitor(s) in order to increase its local polysilicon perimeter density, when it is positioned adjacent to a first block with a relatively low polysilicon perimeter density. Alternatively, a second block can be reconfigured by replacing its decoupling capacitor(s) in order to decrease its local polysilicon perimeter density, when it is positioned adjacent to a first block with a relatively high polysilicon perimeter density. However, if the predetermined value for the across-chip uniform polysilicon perimeter density is a relatively high value, more of the second blocks could be reconfigured to increase their local polysilicon perimeter density and, if the predetermined value is a relatively low value, more of the second blocks could be reconfigured to decrease their local polysilicon perimeter density.

In order to increase or decrease the local polysilicon perimeter density of a second block, the decoupling capacitor(s) in the second block can be replaced with at least one substitute decoupling capacitor having the same decoupling capacitance, but a different size, a different aspect ratio and/or serpentined edges. For example, to increase local polysilicon perimeter density, one large decoupling capacitor in a second block can be replaced by a bank of smaller decoupling capacitors and/or a low aspect ratio decoupling capacitor can be replaced by a high aspect ratio decoupling capacitor. An alternative technique for increasing the local polysilicon perimeter density of a second block is to replace a decoupling capacitor with a substitute decoupling capacitor, having the same decoupling capacitance, but serpentined edges. Contrarily, in order to decrease local polysilicon perimeter density, several smaller decoupling capacitors can be replaced by one large decoupling capacitor and/or a high aspect ratio decoupling capacitor can be replaced by a low aspect ratio decoupling capacitor.

As with the processes used for determining the configurations for the first blocks and the initial second block(s), the process of reconfiguring the second block(s) can be customized. Alternatively, the reconfiguring process can comprise selecting, for any one or more of the second blocks, a substitute decoupling capacitor cell from amongst the predefined decoupling capacitor cells in the ASIC cell library. Selection of the substitute decoupling capacitor cell(s) can be based, at least in part, on known polysilicon perimeter densities of the predefined decoupling capacitor cells within the ASIC cell library in order to balance out different local polysilicon perimeter densities across the chip, and thereby achieve polysilicon perimeter density uniformity across the chip.

Following the reconfiguring process, the decoupling capacitance is reassessed to account for any changes resulting from the reconfiguring process.

Also disclosed herein are embodiments of an integrated circuit structure formed according to the above-described method and comprising a chip. In the integrated circuit structure embodiments, multiple first blocks are located on the chip. These first blocks comprise functional devices. At least one second block is also located on the chip adjacent to the multiple first blocks. Each second block comprises at least one decoupling capacitor. In the present invention, each second block has a predetermined configuration so that all second blocks combined have a predetermined decoupling capacitance and further so that polysilicon perimeter density is approximately uniform across the chip and, optionally, is approximately equal to a predetermined value.

As mentioned above, polysilicon perimeter density can be defined as the sum of the perimeter of polysilicon shapes in a defined region (e.g., the entire chip, a block on the chip, etc.) of the integrated circuit divided by the area of the defined region. The multiple first blocks have different local polysilicon perimeter densities and each second block has the predetermined configuration so as to balance out the different local polysilicon perimeter densities of the multiple first blocks and, thereby achieve the polysilicon perimeter density that is approximately uniform across the chip.

As result of the polysilicon perimeter density uniformity across the chip, the method embodiments produce an integrated circuit product in which performance parameter variations between the functional devices within different regions of the chip and, more specifically, performance parameter variations that can be attributed to polysilicon perimeter density variations (e.g., threshold voltage variations) are limited.

Also disclosed are embodiments of a design structure for the above-described integrated circuit. The design structure embodiments are embodied in a machine readable medium for designing, manufacturing, or testing the integrated circuit. The design structure can reside on storage medium as a data format used for the exchange of layout data of integrated circuits and can comprise, for example, a netlist.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE SEVERAL VIEWS OF THE DRAWINGS

The embodiments of the invention will be better understood from the following detailed description with reference to the drawings, in which.

DETAILED DESCRIPTION OF THE INVENTION

Figure 1:
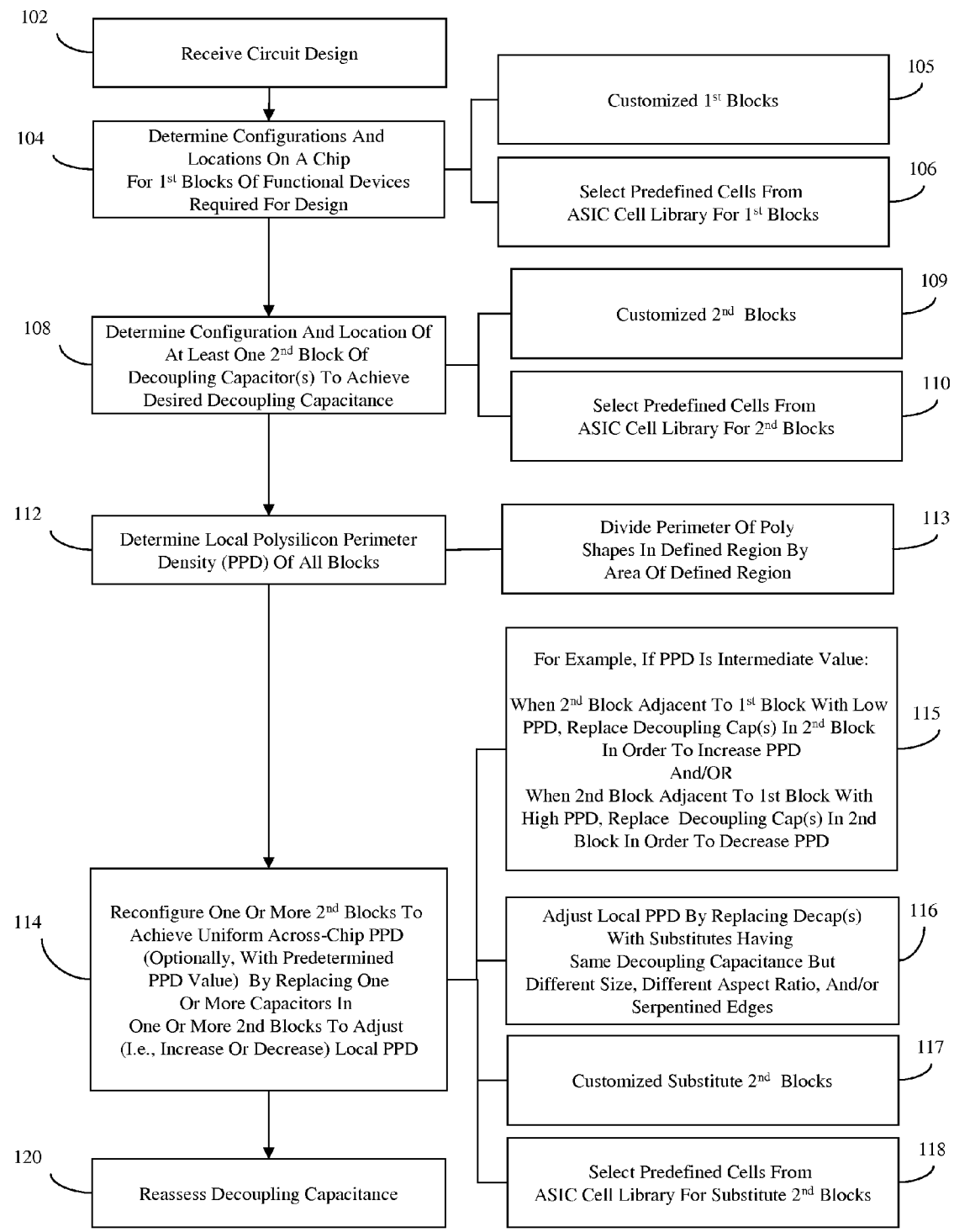
FIG. 1 is a flow diagram illustrating an embodiment of the method of the present invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, with continued scaling of integrated circuit devices, product developers have noticed variations in performance parameters of devices located within different regions on the same chip. In researching this phenomenon, the present inventors have linked such across-chip performance parameter variations to polysilicon perimeter density variations. Polysilicon perimeter density being defined as the sum of the perimeter of polysilicon shapes, such as polysilicon gate structures, in a defined location on an integrated circuit divided by the area of that defined location. Dielectric spacer thickness and, thereby affects device performance, are a function of polysilicon perimeter density. That is, chip regions with high polysilicon perimeter density have thinner dielectric spacers. Due to the thinner dielectric spacers, devices in such regions have, for example, relatively lower threshold voltages. Alternatively, chip regions with low polysilicon perimeter density have thicker dielectric spacers. Due to the thicker dielectric spacers, devices in such regions have, for example, relatively higher threshold voltages. Across-chip polysilicon perimeter density variations increase with each new technology node. As a result, any phenomenon attributable or correlated with such polysilicon perimeter density variations (e.g., across-chip variations in threshold voltage) will get successively worse with each new technology node. Unfortunately, current design verification tools do not take into account systematic within chip variation and are unable to respond to phenomenon related to polysilicon perimeter density variations.

In view of the foregoing, disclosed herein are embodiments of a method of laying out an integrated circuit design so that once the integrated circuit is formed a desired decoupling capacitance is achieved and further so that across-chip polysilicon perimeter density will be approximately uniform and, optionally, approximately equal to a predetermined value. The method embodiments achieve the desired decoupling capacitance and the uniform and targeted across-chip polysilicon perimeter density by laying out the functional blocks to form the circuit according to the design and also laying out one or more decoupling capacitor blocks to achieve the desired decoupling capacitance. Then, local polysilicon perimeter densities of the blocks are determined and, as necessary, the decoupling capacitor blocks are reconfigured in order to adjust for differences in the local polysilicon perimeter densities. This reconfiguring is performed in a manner that essentially maintains the desired decoupling capacitance. Due to the across-chip polysilicon perimeter density uniformity, functional devices in different regions of the chip will exhibit limited performance parameter variations (e.g., limited threshold voltage variations). Also disclosed herein are embodiments of an integrated circuit structure formed according to the method embodiments and a design structure for the integrated circuit.

More particularly, referring to FIG. 1, in the method embodiments, the design for the integrated circuit is received (102). Then, the configurations and locations for multiple first blocks 210a-c comprising functional devices 212a-c, which are required to form the integrated circuit according to the received design, are determined (104, see FIG. 2). The functional devices 212a-c in these first blocks 210a-c (i.e., in the functional blocks) can comprise, for example, memory arrays, ESD input networks, input/outputs, analog circuitry, custom logic, etc.

The method embodiments can be incorporated into a completely customized circuit design layout process or into an Application-Specific Integrated Circuit (ASIC) design layout process. That is, the configurations of the first blocks 210a-c can be customized (105). Alternatively, the configurations of the first blocks 210a-c can be determined by selecting the first blocks 210a-c from amongst predefined functional device cells in an ASIC cell library (106). Arrangement of these functional blocks 210a-c on the chip 200 can be accomplished, for example, using conventional techniques so that interrelated blocks are placed in a spatial relationship relative to each other that is efficient for fabrication.

Additionally, to achieve a desired decoupling capacitance, the location on the chip 200 and the configuration of one or more second blocks 220a-c (i.e., decoupling capacitor blocks), each comprising one or more decoupling capacitors 222a-c, are determined (108).

It should also be understood that for the purposes of the method and structure embodiments disclosed herein a decoupling capacitor is a capacitor device comprising both active silicon (e.g., a first capacitor plate) and polysilicon (e.g., a second capacitor plate) separated by a dielectric layer. These decoupling capacitor devices are used to add noise margin to an integrated circuit by adding capacitance to remove high frequency switching noise from impacting sensitive circuitry. Typically, decoupling capacitor cells are added in parallel with the power distribution. They are placed throughout the integrated circuit design and, particularly, are placed close to noise sensitive circuits where room allows. As with the first blocks, the configurations of the second blocks 220a-c can be customized (109). Alternatively, the configurations for the second blocks 220a-c can be determined by selecting the second blocks 220a-c from amongst predefined decoupling capacitor cells in an ASIC cell library (110). As with the first blocks 210a-c, arrangement of these decoupling capacitor blocks 210a-c on the chip 200 can be accomplished, for example, using conventional techniques so that interrelated blocks are placed in a spatial relationship relative to each other that is efficient for fabrication.

Once the first and second blocks 210a-c, 220a-c (i.e., the functional and decoupling capacitor blocks, respectively) are laid out on the chip 200 (at process 104-110), the different local polysilicon perimeter densities of these blocks are determined (112). Polysilicon perimeter density can be determined by dividing the sum of the perimeter of all polysilicon shapes in a defined region of the integrated circuit (e.g., the entire chip, a block on the chip, etc.) by the area of the defined region (113). Therefore, the unit of measurement for polysilicon perimeter density is 1/a length unit (e.g., 1/mm, 1/microns, etc.).

Figure 2:
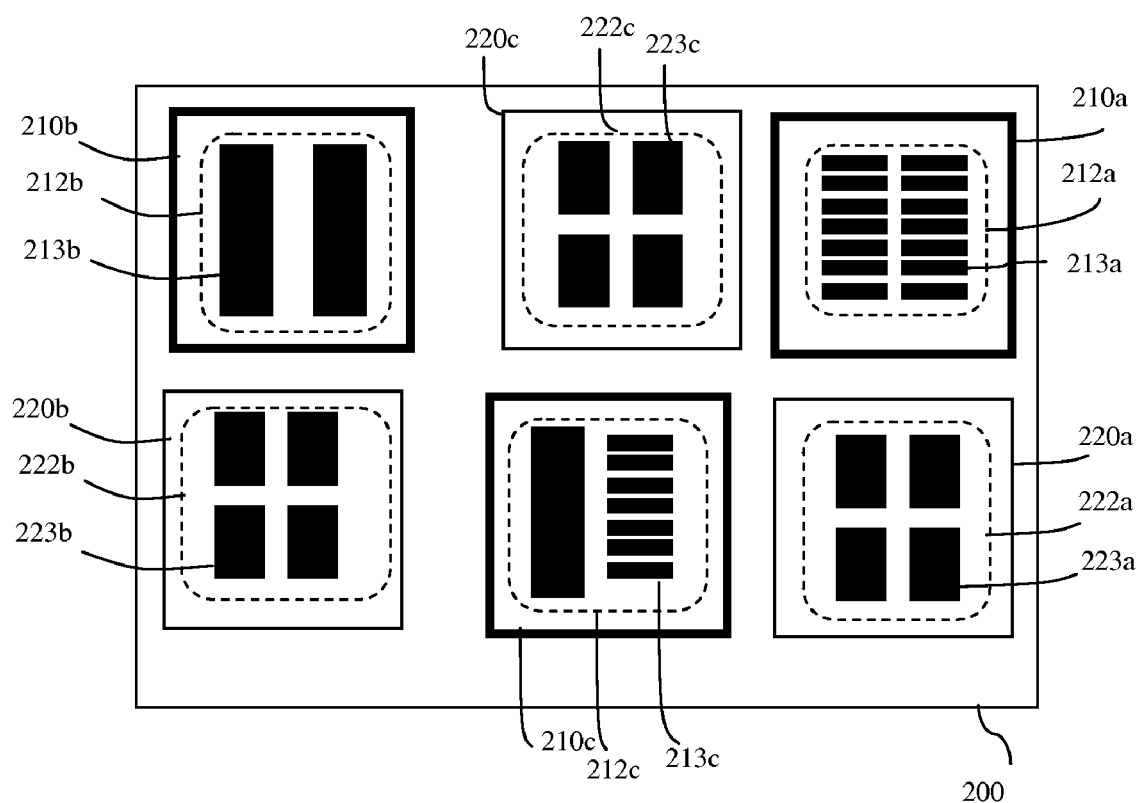
FIG. 2 is a block diagram illustrating a partially completed integrated circuit structure formed according to the method of FIG. 1.

In the first blocks 210a-c, the polysilicon shapes 213a-c can comprise for example, polysilicon gate conductors or other polysilicon components of the functional devices 212a-c. In the second blocks 220a-c, the polysilicon shapes 223a-c can comprise, for example, polysilicon capacitor plates. In the illustration of FIG. 2, the first blocks 210a-c and the second blocks 220a-c all have approximately the same area. Therefore, as illustrated, the local polysilicon perimeter density of the first block 210a will be relatively high because of the large number of smaller polysilicon shapes 213a. The local polysilicon perimeter density of the first block 210b will be relatively low because of the small number of large polysilicon shapes 213b. Finally, the local polysilicon perimeter density of the first block 210c and the second blocks 220a-c will be some intermediate density because of the varying number of different size and polysilicon shapes. It should be understood that FIG. 2 is offered for illustration purposes only. Thus, although all of the blocks 210a-c and 220a-c are illustrated as rectangular in shape and having the same area, these blocks 210a-c and 220a-c will likely vary in shape and area, depending upon the required devices contained therein.

Next, if necessary, one or more of the second blocks 220a-c of FIG. 2 are reconfigured (e.g., into second blocks 320a-c of FIG. 3) in order to achieve a polysilicon perimeter density that is approximately uniform across the chip 200, while also essentially maintaining the desired decoupling capacitance (114). This reconfiguring process can also, optionally, be performed so that the polysilicon perimeter density, which is approximately uniform across the chip 200, is also approximately equal to a predetermined value.

Specifically, the reconfiguring process is performed by replacing one or more of the decoupling capacitors 222a-c in one or more of the second blocks 220a-c of FIG. 2 in order to adjust (i.e., increase or decrease, as necessary) the local polysilicon perimeter density of those second blocks 220a-c. For example, as illustrating FIG. 3, the decoupling capacitors 222a-c in second blocks 220a-c of FIG. 2 can be replaced with the decoupling capacitors 322a-c in the reconfigured second blocks 320a-c of FIG. 3. That is, replacement of the decoupling capacitors 222a-c of FIG. 2 with decoupling capacitors 322a-c of FIG. 3 ensures that the reconfigured second blocks 320a-c have different polysilicon shapes 323a-c and, thereby different local polysilicon perimeter densities than the original second blocks 220a-c of FIG. 2. Adjusting the local polysilicon perimeter densities of the original second blocks 220a-c (i.e., reconfiguring the original second blocks 220a-c) is performed in order to balance out any differences in the local polysilicon perimeter densities of the multiple first blocks 210a-c. Balancing out the different local polysilicon perimeter densities of the multiple first blocks 210a-c ensures that a polysilicon perimeter density that is approximately uniform across the chip is achieved.

Figure 3:
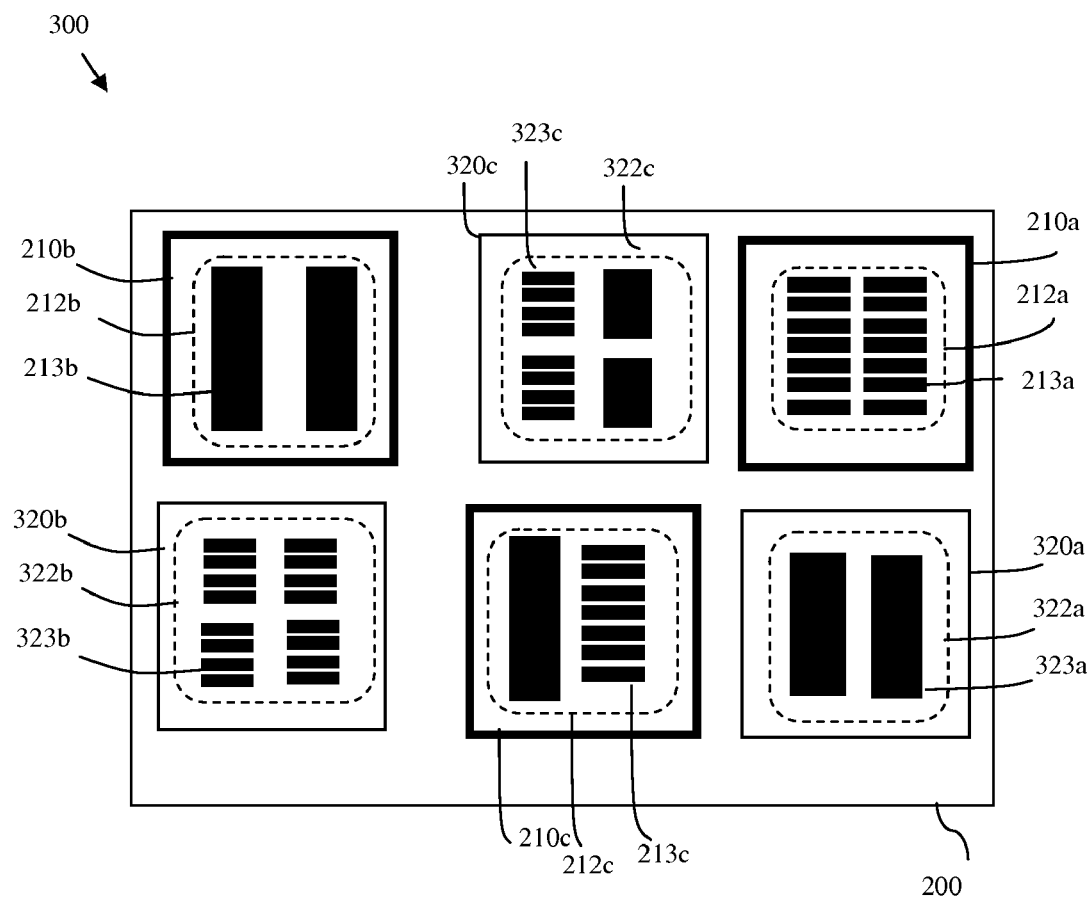
FIG. 3 is a block diagram illustrating an embodiment of the integrated circuit structure of the present invention formed according to the method of FIG. 1.

For example, if the predetermined value for the across-chip uniform polysilicon perimeter density comprises an intermediate value, then the reconfiguring process can comprise reconfiguring a second block by replacing its decoupling capacitor(s) in order to increase its local polysilicon perimeter density, when it is positioned adjacent to a first block with a relatively low polysilicon perimeter density (115, e.g., see reconfiguration of second block 220b of FIG. 2 adjacent to first block 210b into second block 320b of FIG. 3). Alternatively, a second block can be reconfigured by replacing its decoupling capacitor(s) in order to decrease its local polysilicon perimeter density, when it is positioned adjacent to a first block with a relatively high polysilicon perimeter density (115, e.g., see reconfiguration of second block 220a of FIG. 2 adjacent to first block 210a into second block 320a). However, it should be understood that if the predetermined value for the across-chip uniform polysilicon perimeter density is a relatively high value, more of the second blocks could be reconfigured to increase their local polysilicon perimeter density and, if the predetermined value is a relatively low value, more of the second blocks could be reconfigured to decrease their local polysilicon perimeter density.

Figure 4:
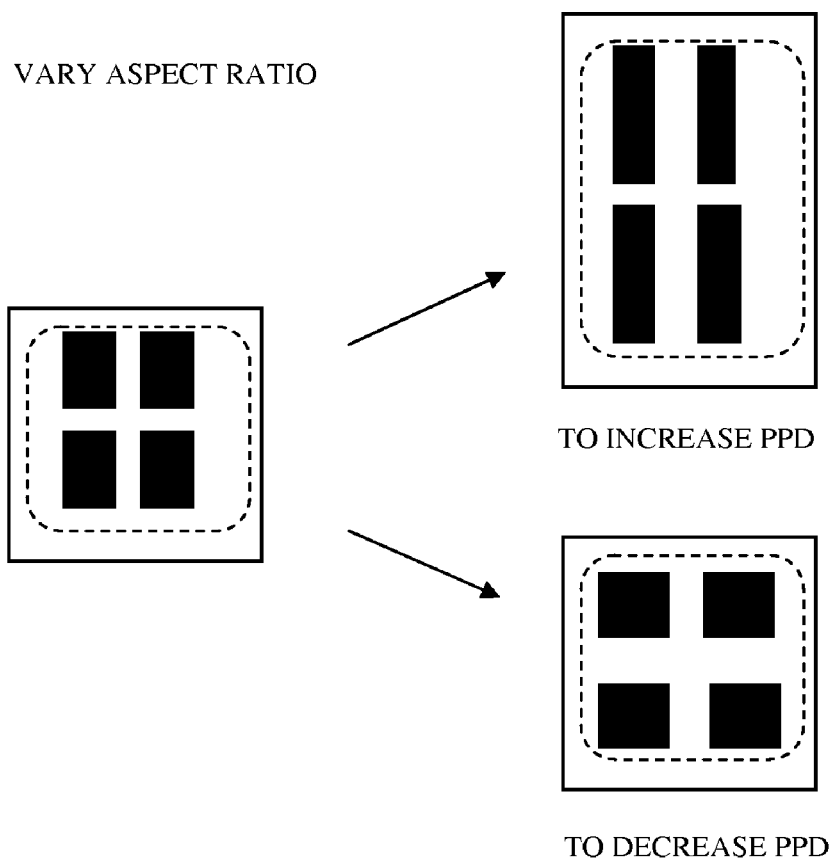
FIG. 4 is a block diagram illustrating decoupling capacitor blocks having capacitors with different aspect ratios and, thereby different polysilicon perimeter densities.
Figure 5:
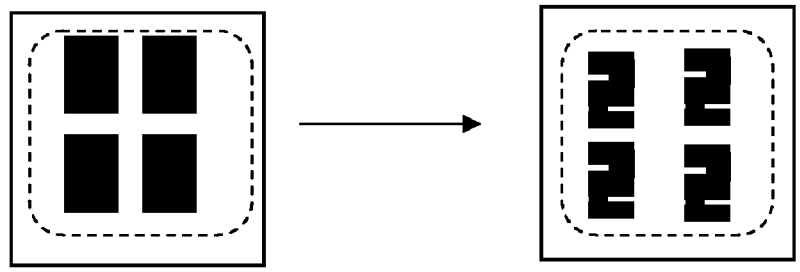
FIG. 5 is a block diagram illustrating a decoupling capacitor having capacitors with different edges and, thereby different polysilicon perimeter densities.

In order to increase or decrease the local polysilicon perimeter density of a second block, one or more decoupling capacitors in that second block can be replaced with one or more substitute decoupling capacitors having the same decoupling capacitance, but a different size, a different aspect ratio and/or serpentined edges (116). For example, to increase local polysilicon perimeter density in a second block, one or more large decoupling capacitors in that second block can be replaced by one or more banks of smaller decoupling capacitors (e.g., as illustrated in the reconfiguration of second blocks 220b and 220c of FIG. 2 into second blocks 320b and 320c of FIG. 3, respectively). Similarly, to increase local polysilicon perimeter density in a second block, one or more lower aspect ratio decoupling capacitors in that second block can be replaced by one or more higher aspect ratio decoupling capacitors (e.g., as illustrated in FIG. 4). That is, the polysilicon area of the decoupling capacitor(s) remains constant, but the perimeter density is modified, in this case increased. An alternative technique for increasing the local polysilicon perimeter density of a second block, is to replace one or more decoupling capacitors in that second block with one or more substitute decoupling capacitors, having the same decoupling capacitance, but serpentined (i.e., folded or curved) edges (as illustrated in FIG. 5). Contrarily, in order to decrease local polysilicon perimeter density in a second block, several smaller decoupling capacitors can be replaced by a large decoupling capacitor (e.g., as illustrated in the reconfiguration of second block 220a of FIG. 2 to second block 320a of FIG. 3) and/or a higher aspect ratio decoupling capacitor can be replaced by a lower aspect ratio decoupling capacitor (e.g., as illustrated in FIG. 4). That is, the polysilicon area of the decoupling capacitor(s) remains constant, but the perimeter density is modified, in this case decreased.

As with the process of determining the configurations for the first blocks and the initial second block(s), the reconfigured second block(s) can be customized (117). Alternatively, the reconfiguring process can comprise selecting, for any one or more of the second blocks, a substitute decoupling capacitor cell from amongst the predefined decoupling capacitor cells in an ASIC cell library (118). Selection of the substitute decoupling capacitor cell(s) can be based, at least in part, on known polysilicon perimeter densities of the predefined decoupling capacitor cells within the ASIC cell library in order to balance out different local polysilicon perimeter densities across the chip, and thereby achieve polysilicon perimeter density uniformity across the chip.

Following the reconfiguring process, the decoupling capacitance is reassessed to account for any changes resulting from the reconfiguring process (i.e., to provide correct expected decoupling capacitance values in the final product specifications) (120).

Also disclosed herein are embodiments of an integrated circuit structure 300 of FIG. 3 formed according to the above-described method and comprising a chip 200. In the integrated circuit structure 300 embodiments, multiple first blocks 210a-c are located on the chip 200. These first blocks 210a-c comprise functional devices 212a-c comprising (e.g., memory arrays, ESD input networks, input/outputs, analog circuitry, custom logic, etc.). Each of these functional devices 212a-c can comprise polysilicon components 213a-c (e.g., polysilicon gate conductors or other polysilicon components).

The integrated circuit structure 300 can further comprise at least one second block 320a-c located on the chip 200 adjacent to the multiple first blocks 210a-c. Each second block 220a-c comprises at least one decoupling capacitor 322a-c, which comprises polysilicon components 323a-c (e.g., polysilicon capacitor plates).

In the present invention, each second block 320a-c has a predetermined configuration so that all of the second blocks 320a-c combined have a predetermined decoupling capacitance and further so that polysilicon perimeter density is approximately uniform across the chip 200 and, optionally, is approximately equal to a predetermined value.

As mentioned above, polysilicon perimeter density can be defined as the sum of the perimeter of polysilicon shapes in a defined region (e.g., the entire chip, a block on the chip, etc.) of the integrated circuit divided by the area of the defined region. The multiple first blocks 210a-c have different local polysilicon perimeter densities and each second block 320a-c has its own specific predetermined configuration so as to balance out the different local polysilicon perimeter densities of the multiple first blocks and, thereby achieve the polysilicon perimeter density that is approximately uniform across the chip.

As result of the polysilicon perimeter density uniformity across the chip, the method embodiments of the present invention produce an integrated circuit product 300 in which performance parameter variations between the functional devices 212a-c within different regions of the chip 200 and, more specifically, performance parameter variations that can be attributed to polysilicon perimeter density variations (e.g., threshold voltage variations) are limited.

Figure 6:
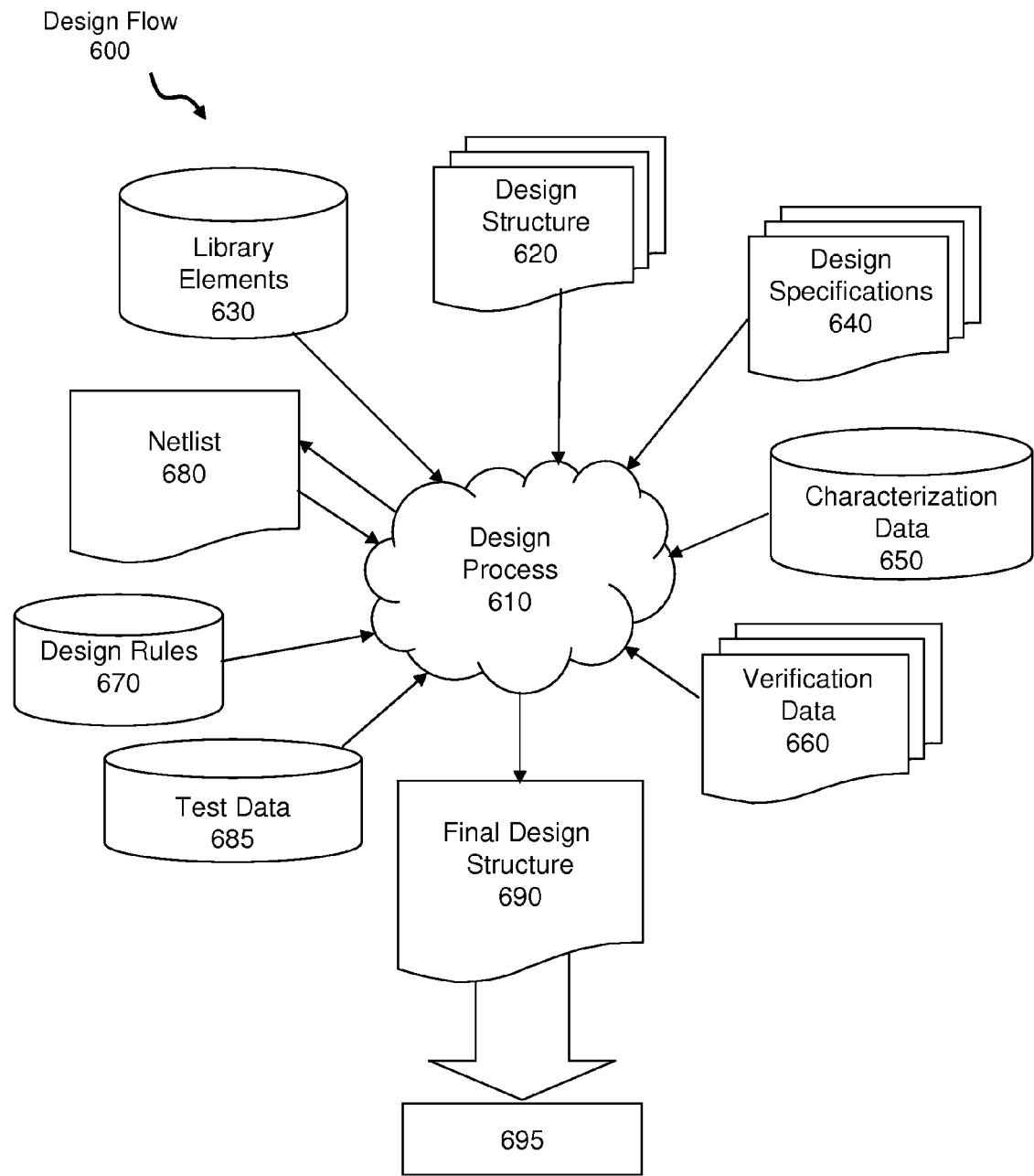
FIG. 6 is a flow diagram of a design process used in semiconductor design, manufacture, and/or test.

Finally, also disclosed herein are embodiments of a design structure embodied in a machine readable medium for designing, manufacturing, or testing the above-described integrated circuit 300 illustrated in FIG. 3. More specifically, FIG. 6 shows a block diagram of an exemplary design flow 600 used for example, in semiconductor design, manufacturing, and/or test. Design flow 600 may vary depending on the type of IC being designed. For example, a design flow 600 for building an application specific IC (ASIC) may differ from a design flow 600 for designing a standard component. Design structure 620 is preferably an input to a design process 610 and may come from an IP provider, a core developer, or other design company or may be generated by the operator of the design flow, or from other sources. Design structure 620 comprises an embodiment of the invention as shown in FIG. 3 in the form of schematics or HDL, a hardware-description language (e.g., Verilog, VHDL, C, etc.). Design structure 620 may be contained on one or more machine readable medium. For example, design structure 620 may be a text file or a graphical representation of an embodiment of the invention as shown in FIG. 3. Design process 610 preferably synthesizes (or translates) an embodiment of the invention as shown in FIG. 3 into a netlist 680, where netlist 680 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 680 is resynthesized one or more times depending on design specifications and parameters for the circuit.

Design process 610 may include using a variety of inputs; for example, inputs from library elements 630 which may house a set of commonly used elements, circuits, and devices, including models, layouts, and symbolic representations, for a given manufacturing technology (e.g., different technology nodes, 32 nm, 45 nm, 90 nm, etc.), design specifications 640, characterization data 650, verification data 660, design rules 670, and test data files 685 (which may include test patterns and other testing information). Design process 610 may further include, for example, standard circuit design processes such as timing analysis, verification, design rule checking, place and route operations, etc. One of ordinary skill in the art of integrated circuit design can appreciate the extent of possible electronic design automation tools and applications used in design process 610 without deviating from the scope and spirit of the invention. The design structure of the invention is not limited to any specific design flow.

Design process 610 preferably translates an embodiment of the invention as shown in FIG. 3, along with any additional integrated circuit design or data (if applicable), into a second design structure 690. Design structure 690 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 690 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 3. Design structure 690 may then proceed to a stage 695 where, for example, design structure 690: proceeds to tape-out, is released to manufacturing, is released to a mask house, is sent to another design house, is sent back to the customer, etc.

Therefore, disclosed above are embodiments of a method of laying out an integrated circuit design so that once the integrated circuit is formed a desired decoupling capacitance is achieved and further so that across-chip polysilicon perimeter density will be approximately uniform and, optionally, approximately equal to a predetermined value. The method embodiments achieve the desired decoupling capacitance and the uniform and targeted across-chip polysilicon perimeter density by laying out the functional blocks to form the circuit according to the design and also laying out one or more decoupling capacitor blocks to achieve the desired decoupling capacitance. Then, local polysilicon perimeter densities of the blocks are determined and, as necessary, the decoupling capacitor blocks are reconfigured in order to adjust for differences in the local polysilicon perimeter densities. This reconfiguring is performed in a manner that essentially maintains the desired decoupling capacitance. Due to the across-chip polysilicon perimeter density uniformity, functional devices in different regions of the chip will exhibit limited performance parameter variations (e.g., limited threshold voltage variations). Also disclosed are embodiments of an integrated circuit structure formed according to the method embodiments and a design structure for the integrated circuit.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. An integrated circuit comprising:
   a chip;
   multiple first blocks on said chip, said multiple first blocks comprising functional devices; and
   multiple second blocks on said chip adjacent to said multiple first blocks, each of said second blocks comprising at least one decoupling capacitor and having a predetermined configuration so that a predetermined combined total decoupling capacitance is exhibited by said multiple second blocks and further so that polysilicon perimeter density is approximately uniform across said chip, said polysilicon perimeter density being the sum of the perimeter of polysilicon shapes in a defined region of said integrated circuit divided by the area of said defined region.

2. The integrated circuit according to claim 1, said multiple first blocks having different local polysilicon perimeter densities and said multiple second blocks has having different predetermined configurations so as to balance out said different local polysilicon perimeter densities of said multiple first blocks in order to achieve said polysilicon perimeter density that is approximately uniform across said chip.

3. The integrated circuit according to claim 2, said multiple second blocks further having said different predetermined configurations so that said polysilicon perimeter density that is approximately uniform across said chip is also approximately equal to a predetermined value.

4. The integrated circuit according to claim 1, wherein performance parameter variations between said functional devices in different regions of said chip and attributable to polysilicon perimeter density variations are limited as a result of said polysilicon perimeter density that is approximately uniform across said chip.

5. A design structure for an integrated circuit, said design structure comprising at least layout parameters, test pattern and other testing information, and manufacturing line routing information, said design structure being embodied in a non-transitory storage medium and readable by a machine that processes said design structure to produce said integrated circuit, said integrated circuit comprising:
- a chip said design structure;
- multiple first blocks on said chip, said multiple first blocks comprising functional devices; and
- multiple second blocks on said chip adjacent to said multiple first blocks, each of said second blocks comprising at least one decoupling capacitor and having a predetermined configuration so that a predetermined combined total decoupling capacitance is exhibited said multiple second blocks and further so that polysilicon perimeter density is approximately uniform across said chip, said polysilicon perimeter density being the sum of the perimeter of polysilicon shapes in a defined region of said integrated circuit divided by the area of said defined region.

6. The design structure according to claim 5, said design structure comprising a netlist.

7. The design structure according to claim 5, said design structure residing on storage medium as a data format used for the exchange of layout data of integrated circuits.

8. The design structure according to claim 5, said multiple first blocks having different local polysilicon perimeter densities and said multiple second blocks having different predetermined configurations so as to balance out said different local polysilicon perimeter densities of said multiple first blocks in order to achieve said polysilicon perimeter density that is approximately uniform across said chip.

9. The design structure according to claim 8, said multiple second blocks further having said different predetermined configurations so that said polysilicon perimeter density that is approximately uniform across said chip is also approximately equal to a predetermined value.

* * * * *